United States Patent
Tsunoda

(10) Patent No.: US 12,550,728 B2
(45) Date of Patent: Feb. 10, 2026

(54) SEMICONDUCTOR DEVICE COMPRISING A HEAT DISSIPATION PLATE INCLUDING A THICK PORTION AND A THIN PORTION

(71) Applicant: Mitsubishi Electric Corporation, Tokyo (JP)

(72) Inventor: Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 413 days.

(21) Appl. No.: 18/040,931

(22) PCT Filed: Oct. 21, 2020

(86) PCT No.: PCT/JP2020/039538
§ 371 (c)(1),
(2) Date: Feb. 7, 2023

(87) PCT Pub. No.: WO2022/085110
PCT Pub. Date: Apr. 28, 2022

(65) Prior Publication Data
US 2023/0317547 A1    Oct. 5, 2023

(51) Int. Cl.
*H01L 23/36* (2006.01)
*H01L 23/367* (2006.01)

(52) U.S. Cl.
CPC ................. *H01L 23/3672* (2013.01)

(58) Field of Classification Search
CPC .................................................. H01L 23/3672
USPC ......................................................... 257/717
See application file for complete search history.

(56) References Cited

U.S. PATENT DOCUMENTS

| | | |
|---|---|---|
| 2003/0116312 A1 | 6/2003 | Krassowski et al. |
| 2010/0172091 A1 | 7/2010 | Nishiura |
| 2015/0130042 A1 | 5/2015 | Sato |
| 2015/0382509 A1 | 12/2015 | Nagata et al. |

(Continued)

FOREIGN PATENT DOCUMENTS

| | | |
|---|---|---|
| CN | 1620592 A | 5/2005 |
| JP | H10-041440 A | 2/1998 |

(Continued)

OTHER PUBLICATIONS

Cite the machine translation (KR-20150035328-A).*

(Continued)

*Primary Examiner* — Phuc T Dang
(74) *Attorney, Agent, or Firm* — Studebaker Brackett PLLC

(57) ABSTRACT

An object is to provide a technique capable of enhancing the heat dissipation characteristics of a semiconductor device. The semiconductor device includes a heat dissipation plate, a layer member connected to the heat dissipation plate, a first semiconductor element, and a second semiconductor element. The first semiconductor element and the second semiconductor element are connected to the layer member on a side opposite to the heat dissipation plate, and separated from each other by a gap. The heat dissipation plate includes a thick portion and a thin portion thinner than the thick portion. The thin portion is in contact with a groove portion provided on a surface of the heat dissipation plate opposite to the layer member, and overlaps the gap in plan view.

7 Claims, 12 Drawing Sheets

(56) References Cited

U.S. PATENT DOCUMENTS

2020/0176348 A1* 6/2020 Lim ................. H01L 23/49562
2021/0035893 A1* 2/2021 Kawashiro ........ H01L 23/49575

FOREIGN PATENT DOCUMENTS

| JP | 2010-153785 A | | 7/2010 | |
|----|---------------|---|--------|---|
| JP | 2016-115782 A | | 6/2016 | |
| KR | 20150035328 A | * | 4/2015 | |
| WO | 2013/141154 A1 | | 9/2013 | |
| WO | 2014-128868 A1 | | 8/2014 | |
| WO | WO-2018146816 A1 | * | 8/2016 | ............. H01L 23/36 |

OTHER PUBLICATIONS

Cite the machine translation Yuguchi J (WO-2018146816).*
An Office Action mailed by China National Intellectual Property Administration on May 8, 2025, which corresponds to Chinese Patent Application No. 202080106262.X and is related to U.S. Appl. No. 18/040,931; with English language translation.
An Office Action mailed by The State Intellectual Property Office of People's Republic of China on Nov. 9, 2024, which corresponds to Chinese Patent Application No. 202080106262.X and is related to U.S. Appl. No. 18/040,931; with English translation.
International Search Report issued in PCT/JP2020/039538; mailed Jan. 19, 2021.
An Office Action; "Notice of Reasons for Refusal," mailed by the Japanese Patent Office on Mar. 7, 2023, which corresponds to Japanese Patent Application No. 2022-556290 and is related to U.S. Appl. No. 18/040,931; with English language translation.

* cited by examiner

SEMICONDUCTOR DEVICE COMPRISING A HEAT DISSIPATION PLATE INCLUDING A THICK PORTION AND A THIN PORTION

TECHNICAL FIELD

The present disclosure relates to a semiconductor device.

BACKGROUND ART

A power module in which a plurality of semiconductor elements are connected to a metal base for heat dissipation via an insulating substrate is known as a semiconductor device including the semiconductor elements. For example, Patent Document 1 proposes a technique of suppressing thermal interference between semiconductor elements by providing grooves on the surface of the metal base on the semiconductor element side.

PRIOR ART DOCUMENTS

Patent Document(s)

[Patent Document 1] international Publication No. 2013/141154

SUMMARY

Problem to be Solved by the Invention

In general, heat generated in a semiconductor element spreads isotropically within a component such as a heat dissipation member connected to the semiconductor element. In other words, the heat generated in the semiconductor element is radiated after being transmitted so as to spread about 45 degrees with respect to the main traveling direction of the heat. Thermal interference, in which heat is accumulated below an area between the semiconductor elements, occurs in a structure in which semiconductor elements are arranged close to each other in order to reduce the size of a semiconductor device, due to the isotropic heat transfer as described above. When such thermal interference occurs, the heat of the semiconductor element cannot be radiated efficiently.

In the technique of Patent Document 1, despite the heat of each semiconductor element being hindered to be transferred to the other semiconductor elements by the grooves, there has been a problem that the occurrence of thermal interference described above leaves the heat dissipation characteristics of the semiconductor device relatively poor.

The present disclosure has been made in view of the aforementioned problem, and it is an object of the present invention to provide a technique that enhances heat dissipation characteristics.

Means to Solve the Problem

According to the present disclosure, the semiconductor device includes a heat dissipation plate, a layer member connected to the heat dissipation plate, and a first semiconductor element and a second semiconductor element connected to the layer member on a side opposite to the heat dissipation plate, and separated from each other by a gap, in which the heat dissipation plate includes a thick portion and a thin portion being thinner than the thick portion and in contact with a groove portion provided on a surface of the heat dissipation plate opposite to the layer member, and overlapping the gap in plan view.

Effects of the Invention

According to the present disclosure, the heat dissipation plate includes the thick portion and the thin portion being in contact with the groove portion provided on the surface of the heat dissipation plate opposite to the layer member, and overlapping the gap in plan view. According to such a configuration, the heat dissipation characteristics of the semiconductor device are enhanced.

The objects, features, aspects, and advantages of the present disclosure will become more apparent from the following detailed description and the accompanying drawings.

DESCRIPTION OF EMBODIMENT(S)

Figure 1:
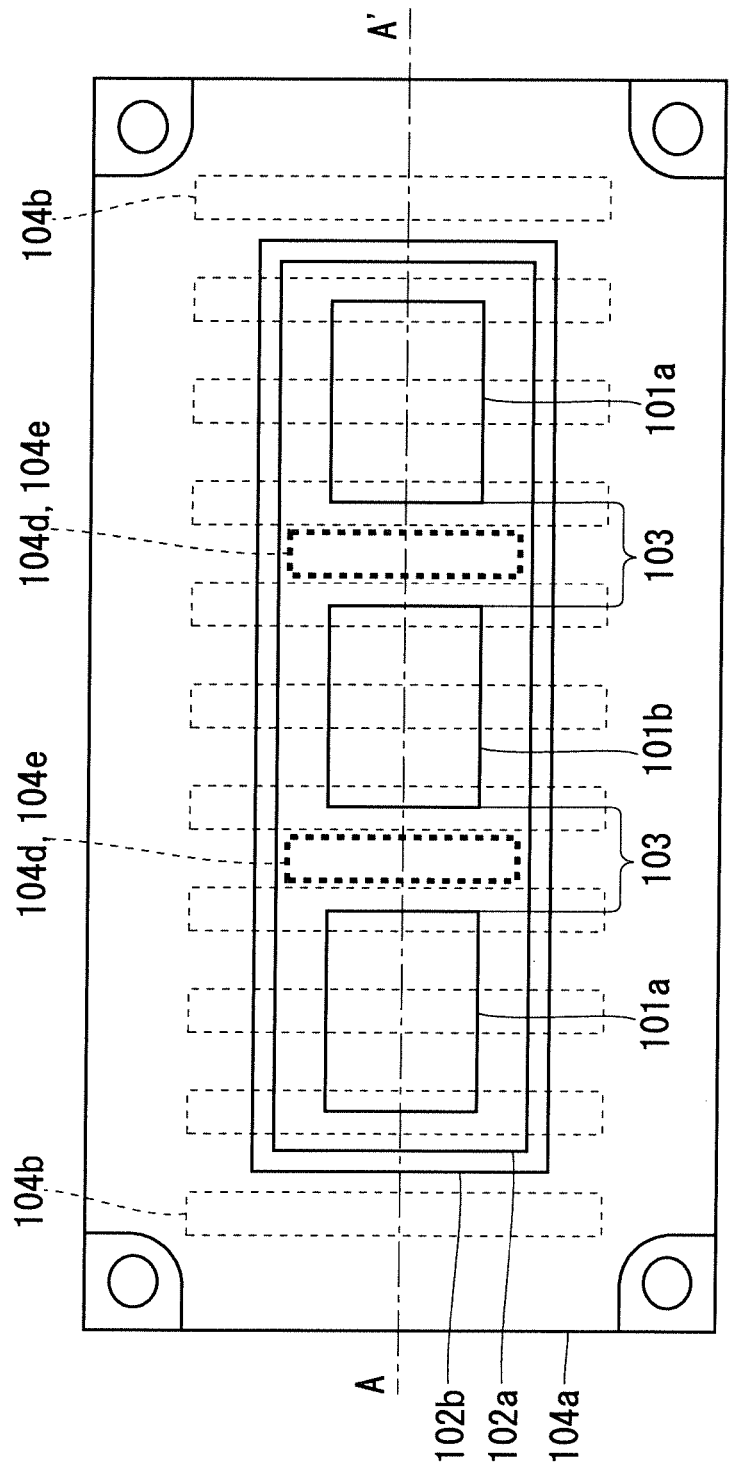
FIG. 1 A plan view illustrating a configuration of a semiconductor device according to a first embodiment.

Hereinafter, embodiments will be described with reference to the attached drawings. The features described in each of the following embodiments are exemplary and not all features are required. Further, in the description to be made below, similar components are designated by the same or similar reference numerals in a plurality of embodiments, and descriptions of different components will be mainly made. Also in the description described below, when terms specifying specific positions and directions such as "up", "low", "left", "right", "front", "back" and the like do not necessarily coincide with the and directions at the time of implementation. Note that a semiconductor device described below may be referred to as power module in some cases.

First Embodiment

Figure 2:
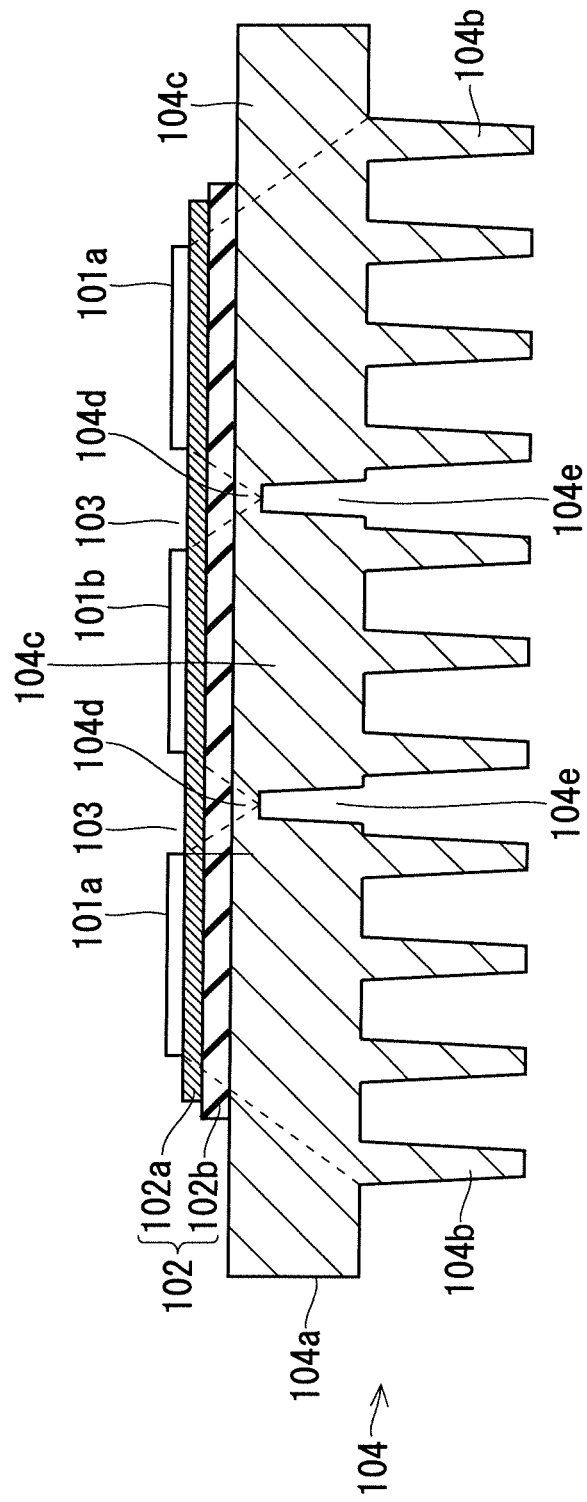
FIG. 2 A cross-sectional view illustrating the configuration of the semiconductor device according to the first embodiment.

FIG. 1 is a plan view illustrating a configuration of a semiconductor device according to a first embodiment, and FIG. 2 is a cross-sectional view taken along the line A-A' in FIG. 1.

The semiconductor device according to the first embodiment includes first semiconductor elements 101a, a second semiconductor element 101b, a layer member 102, and a heat dissipation member 104. As shown in FIG. 2, the heat dissipation member 104 includes a heat dissipation plate 104a and plate-shaped fins 104b.

The layer member 102 is connected to the heat dissipation plate 104a. In the first embodiment, the layer member 102 is connected to the upper surface of the heat dissipation plate 104a, and the upper surface is a single surface, or substantially a single flat plane. Further, the layer member 102 has substantially isotropic thermal conductivity, and the heat dissipation plate 104a of the heat dissipation member 104 has substantially isotropic thermal conductivity as well.

Note that the layer member 102 in FIG. 2 includes a conductor layer 102a and an insulating layer 102b, however, this is not limited thereto, and need only include the conductor layer 102a and the insulating layer 102b.

The first semiconductor elements 101a and the second semiconductor element 101b are connected to the layer member 102 on the side opposite to the heat dissipation plate 104a, and separated from each other by gaps 103. In the example of FIG. 2, the first semiconductor elements 101a and the second semiconductor element 101b are connected to the conductor layer 102a, and the insulating layer 102b is connected between the conductor layer 102a and the heat dissipation plate 104a.

Note that each of the first semiconductor elements 101a and the second semiconductor element 101b includes at least one from an Insulated Gate Bipolar Transistor (IGBT), a Metal Oxide Semiconductor Field. Effect Transistor (MOS-FET), a PN junction Diode (PND), a Schottky Barrier Diode (SBD), and a Free Wheeling Diode (FWD), for example. In the example of FIG. 2, the number of first semiconductor elements 101a is two and the number of second semiconductor elements 101b is one, but the numbers are not limited thereto.

The first semiconductor elements 101a and the second semiconductor element 101b may be composed of a wide bandgap semiconductor. Here, a wide bandgap semiconductor include, for example, silicon carbide (SiC), gallium nitride (GaN), diamond and the like. With such a configuration, a stable operate of the semiconductor device at high temperatures and an increase in switching speed are ensured. SiC is useable at a higher temperature than that at which Si is useable; therefore, SiC is effective for chips (semiconductor elements) that generate a large amount of heat per unit area. Whereas, SiC has a higher defect rate in its crystal per se than that of Si, making an increase in chip area difficult; therefore, in many cases, a plurality of chips having appropriate areas are connected in parallel to control large currents. Although the details will be described later, according to the first embodiment, the heat dissipation characteristics of the semiconductor device enhances; therefore, the first embodiment is effective in a configuration in which a plurality of chips composed of SiC are arranged in parallel for parallel connection and heat generation per unit area of the chips is large.

In a cross-sectional view (FIG. 2), the heat dissipation plate 104a includes a thick portion 104c and thin portions 104d thinner than the thick portion 104c. In the example of FIG. 2, the thin portions 104d are in contact with the groove portions 104e provided on the lower surface of the heat dissipation plate 104a (the surface of the heat dissipation plate 104a opposite to the layer member 102).

The heat dissipation plate 104a is provided with the plate-shaped fins 104b, that is, straight fins, protruding from the lower surface of the heat dissipation plate 104a. When the fins 104b are formed by forging (extrusion), it is preferable to previously form projections corresponding to the groove portions 104e in the forging die for the fins 104b. With such a forging die, the groove portions 104e are also formed at the time of manufacturing (during forging) the fins 104b; therefore, no process for forming groove portions 104e is newly required to be added.

The thin portions 104d and the groove portions 104e overlap the gaps 103 in plan view (FIG. 1). The groove portions 104e are provided only in the ranges of the portions 121 (FIG. 3) where thermal interference described later occurs, and the length of the groove portions 104e is shorter than the length of the fins 104b. The positions and shape of the thin portions 104d are substantially the same as the positions and shape of the groove portions 104e.

Figure 3:
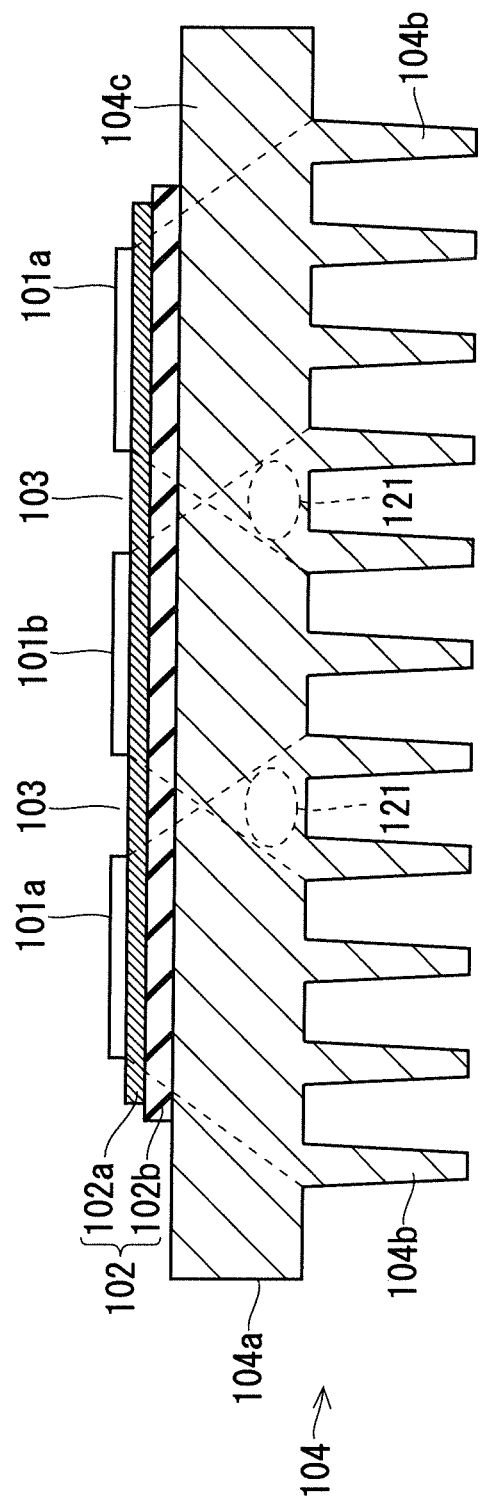
FIG. 3 A cross-sectional view illustrating a configuration of a first related semiconductor device.
Figure 4:
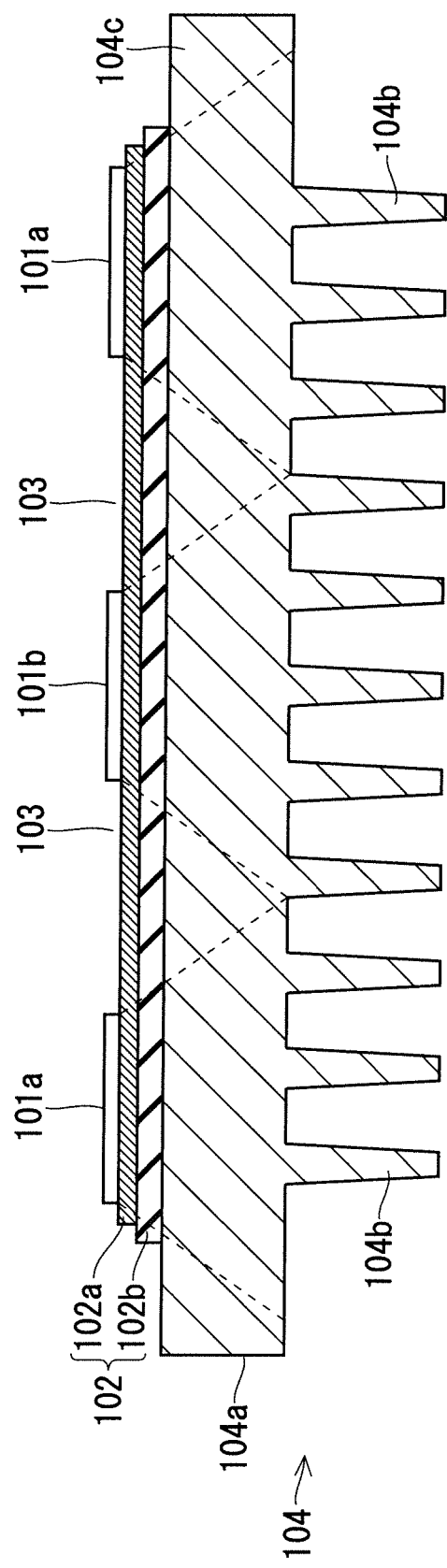
FIG. 4 A cross-sectional view illustrating a configuration of a second related semiconductor device.

Here, a first semiconductor device and a second semiconductor device (hereinafter referred to as a first related semiconductor device and a second related semiconductor device) related to the semiconductor device according to the first embodiment will be described. FIG. 3 and FIG. 4 are cross-sectional views illustrating the configurations of the first related semiconductor device and the second related semiconductor device, respectively and corresponding to FIG. 2.

The configuration of the first related semiconductor device shown in FIG. 3 differs from the configuration of the semiconductor device according to the first embodiment shown in FIG. 1 in that no groove portions 104e are provided on the lower surface of heat dissipation plate 104a.

In the first related semiconductor device of FIG. 3, it is assumed that the heat generated in the first and second semiconductor elements 101a and 101b spreads isotropically in the layer member 102 and the heat dissipation member 104. That is, it is assumed that the heat generated in the first and second semiconductor elements 101a and 101b is transferred so as to spread about 45 degrees with respect to the main traveling directions of the heat, as indicated by the dotted lines in FIG. 3. In this case, in the first related semiconductor device of FIG. 3, heat interference in which the heat from the first and second semiconductor elements 101a and 101b is accumulated occurs in the portions 121 of the heat dissipation member 104 below the gaps 103. Therefore, there is a problem that the heat is not radiated efficiently.

In order to solve this problem, the gaps 103 between the first and second semiconductor elements 101a and 101b are widened as in the second related semiconductor device of FIG. 4, thereby, suppressing the thermal interference in the portions 121 of FIG. 3. However, such a configuration poses a new problem of increasing the size of the semiconductor device.

Also, although not shown, a configuration is conceivable in which, groove portions may be provided on the upper surface of the heat dissipation plate 104a in contact with the gaps 103 in order to suppress heat transfer from ones to the others among the first and second semiconductor elements 101a and 101b. However, in this configuration, the groove portions are located above the dotted lines in FIG. 2, that is, outside the ranges in which heat is isotropically transferred, so that no substantial effect is caused on the isotropic transfer of heat, unable to substantially suppress the thermal interference.

In contrast, according to the semiconductor device according to the first embodiment, the groove portion 104e overlapping the gap 103 in plan view is provided on the lower surface of the heat dissipation plate 104a, thereby the heat dissipation plate 104a including the thin portion 104d overlapping the gap 103 in plan view. According to such a configuration, even if the gap 103 is not wide, the thermal interference in which the heat from the first and second semiconductor elements 101a and 101b is accumulated as indicated by the dotted lines in FIG. 2 is suppressed. Therefore, the heat dissipation characteristics of the semiconductor device is improved without increasing the size of the semiconductor device. Further, the side surfaces of the groove portions 104e are directly cooled by a cooling body (for example, cooling water); therefore, the heat dissipation characteristics of the semiconductor device are enhanced.

Further, according to the first embodiment, the length of groove portions 104e is shorter than the length of fins 104b in plan view. According to such a configuration, the reduction in rigidity of the heat dissipation plate 104a is suppressed.

Note that it is preferable that the layer member 102 including the conductor layer 102a and the insulating layer 102b is not divided in plan view as shown in FIG. 1. According to such a configuration, an increase in the number of parts and deterioration in assemblability are suppressed.

First Modification Example of First Embodiment

Figure 5:
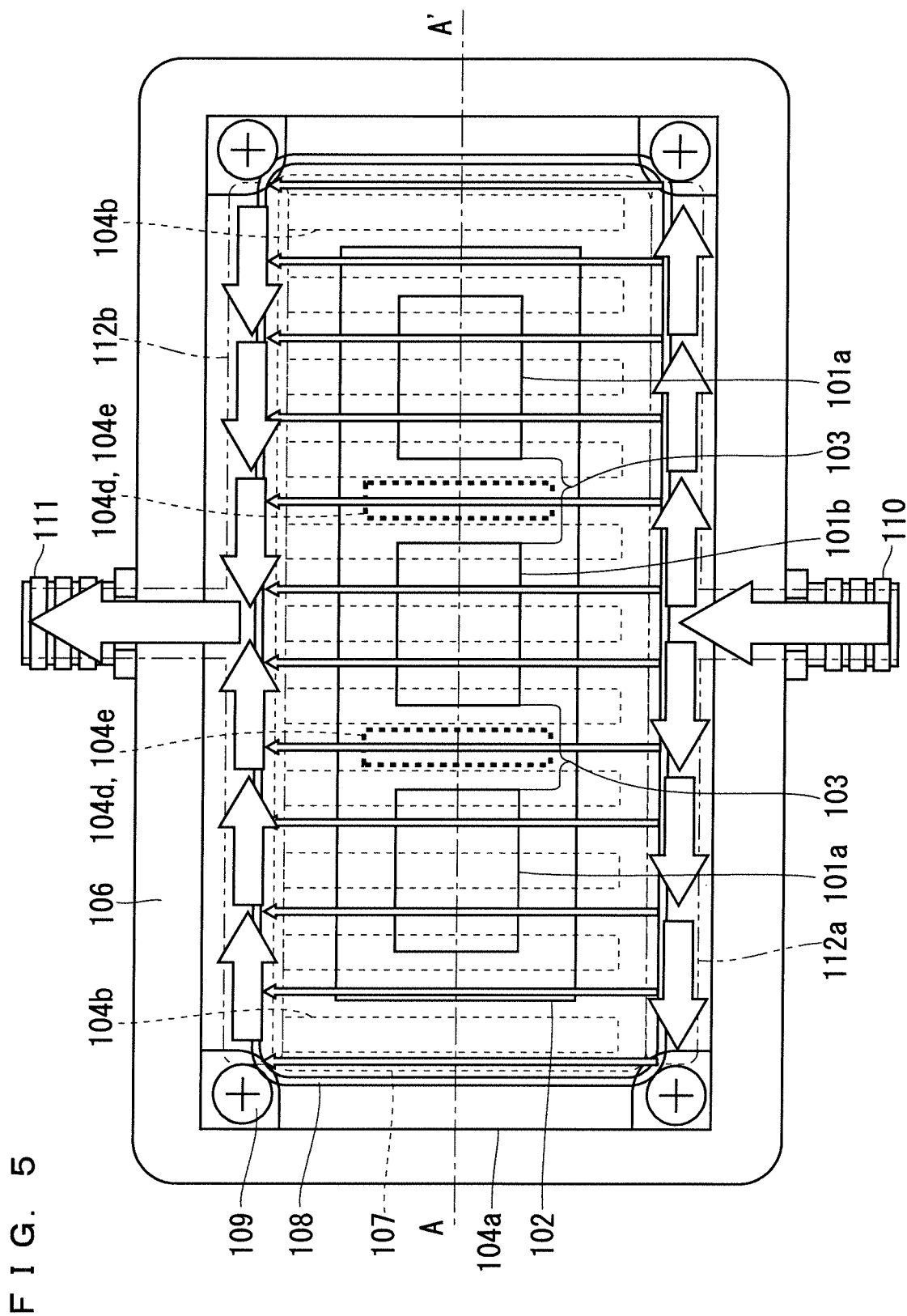
FIG. 5 A plan view showing a configuration of a semiconductor device according to a first modification example of the first embodiment.

FIG. 5 is a plan view of a configuration of a semiconductor device according to a first modification example of the first embodiment. In the first modification example, the semiconductor device is attached to a water cooling jacket 106. The water cooling jacket 106 is provided with a hollowed part 107 in which the fins 104b and cooling water are accommodated such that the cooling water is in direct contact with fins 104b.

An inlet 110 of the water cooling jacket 106 communicates with a groove 112a communicating with a first side of the hollowed part 107, and an outlet 111 of the water cooling jacket 106 communicates with a groove 112b communicating with a second side opposite to the first side of the hollowed part 107. The heat dissipation plate 104a is fixed to the water cooling jacket 106 with screws 109, with an O-ring 108 interposed between the water cooling jacket 106 and heat dissipation plate 104a so that the cooling water in the hollowed part 107 does not leak to the outside.

According to such a water cooling jacket 106 as described above, the cooling water entering from the inlet 110 is dispersed through the groove 112a from the leftmost fin 104b to the rightmost fin 104b, flows between the fins 104b, and is collected by the groove 112b, flowing out from the outlet 111. According to such a configuration, uniform cooling of the fins 104b is implemented.

Second Modification Example of First Embodiment

Figure 6:
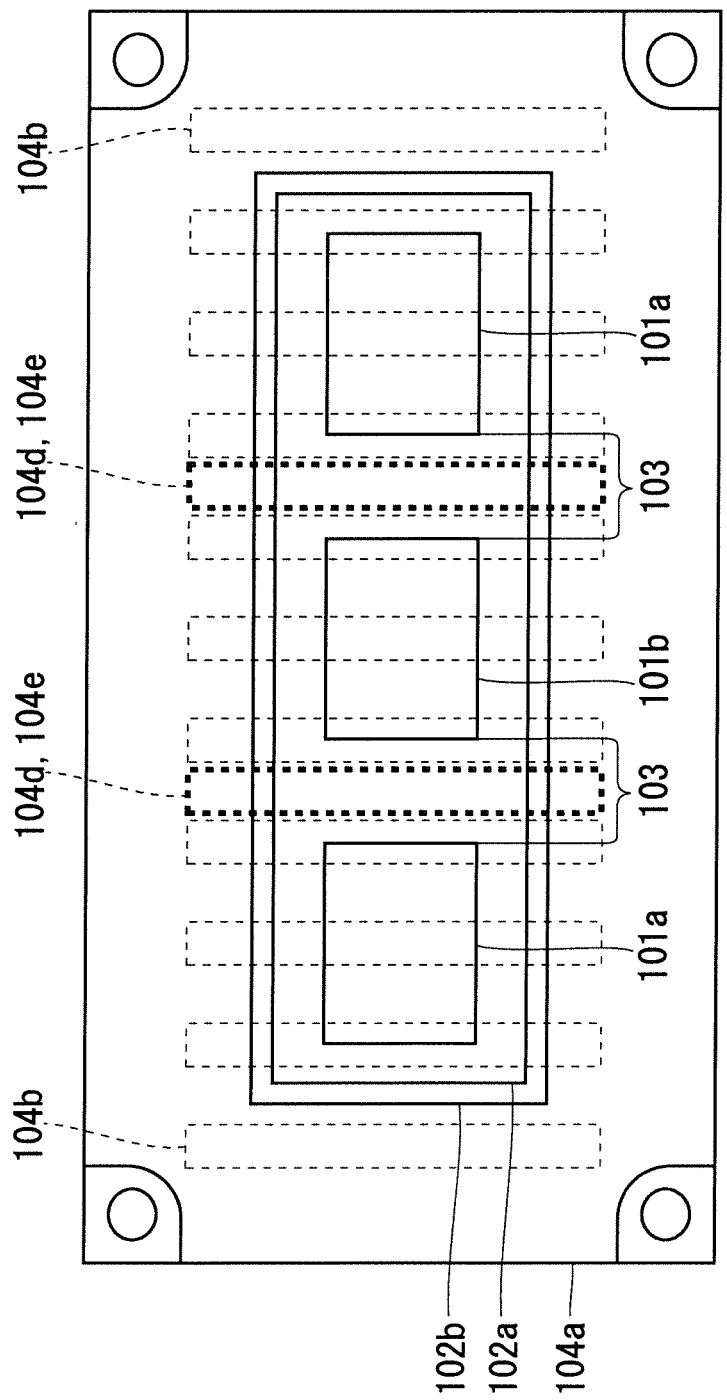
FIG. 6 A plan view illustrating a configuration of a semiconductor device according to a second modification example of the first embodiment.

FIG. 6 is a plan view of a configuration of a semiconductor device according to a second modification example of the first embodiment. In the first embodiment, the length of groove portions 104e is shorter than the length of fins 104b in plan view, but in the second modification example, the length of groove portions 104e is the same as the length of fins 104b in plan view. That is, the groove portions 104e are provided over the entire length of the fins 104b. According to such a semiconductor device according to the second modification example, the contact area of the cooling body with the groove portion 104e is increased, so that the heat dissipation characteristics of the semiconductor device are further enhanced.

Third Modification Example of First Embodiment

Figure 7:
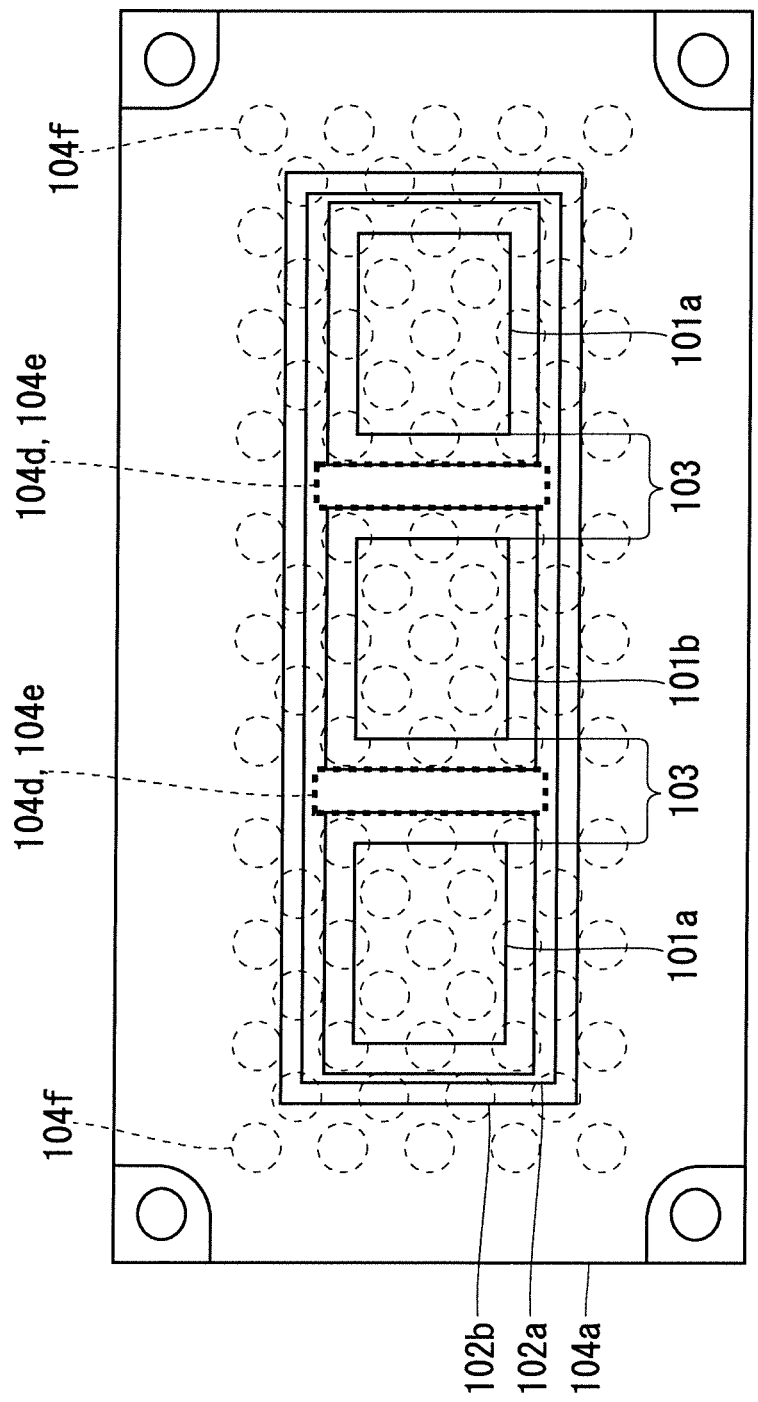
FIG. 7 A plan view illustrating the configuration of a semiconductor device according to a third modification example of the first embodiment.

FIG. 7 is a plan view of a configuration of a semiconductor device according to a third modification example of the first embodiment. In the first embodiment, the plate-shaped fins 104b protruding from the lower surface of heat dissipation plate 104a are provided on heat dissipation plate 104a. In the third modification example, the heat dissipation plate 104a is provided with pin-shaped fins 104f protruding from the lower surface of heat dissipation plate 104a. According to such a semiconductor device according to the third modification example, increasing the level of density of the pin-shaped fins 104f increases the area of the pin-shaped fins 104f directly in contact with water more than that of the plate-shaped fins 104b, enhancing the cooling efficiency.

Fourth Modification Example of First Embodiment

Figure 8:
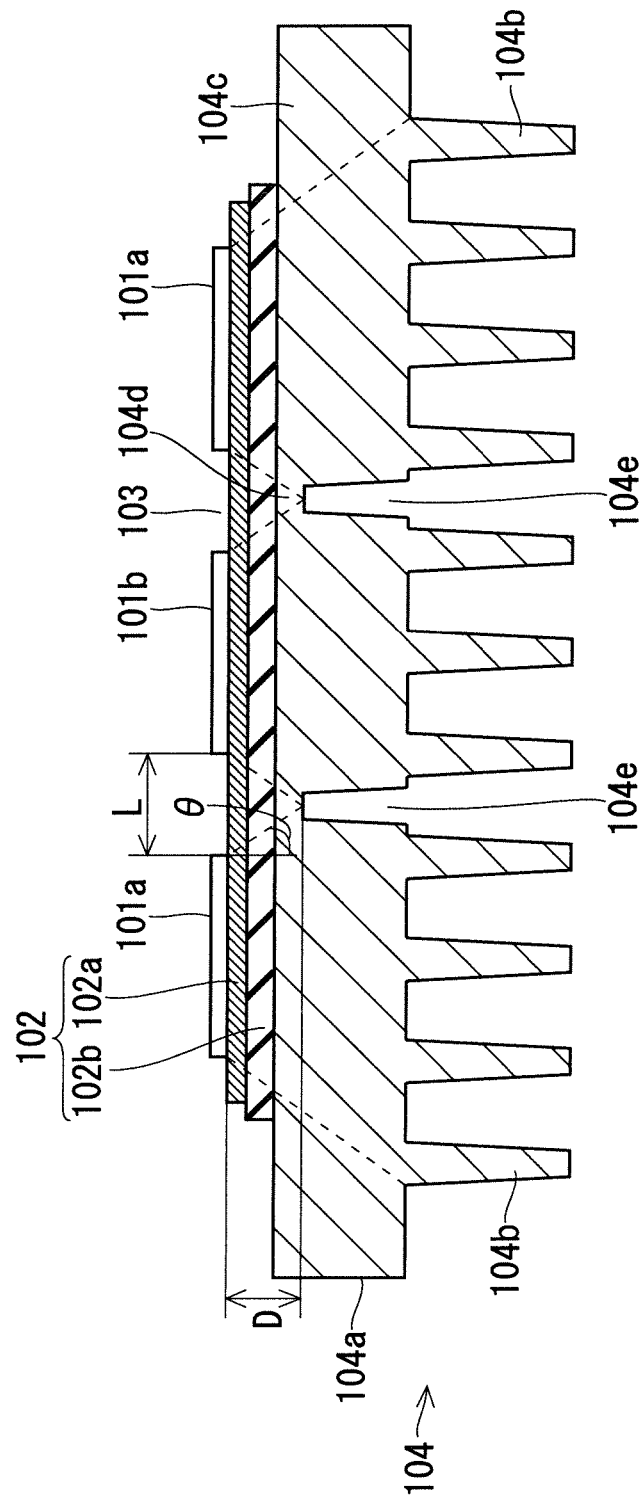
FIG. 8 A cross-sectional view illustrating a configuration of a semiconductor device according to a fourth modification example of the first embodiment.

FIG. 8 is a cross-sectional view of a configuration of a semiconductor device according to a fourth modification example of the first embodiment. Here, L represents the distance of the gap 103, D represents the total thickness of the layer member 102 and the thin portion 104d, and $\theta$ represents the angle between the direction in which heat spreads in the layer member 102 and the thin portion 104d as a whole and the out-of-plane direction of the heat dissipation plate 104a. In this case, in the fourth modification example, $L/2 \geq D \times \tan\theta$ holds. That is, $L/2 \geq D \times \tan\theta$ or $D \leq L/(2 \times \tan\theta)$ holds. According to such a configuration, the thermal interference in which the heat from the first and second semiconductor elements 101a and 101b is accumulated is suppressed. Even if the expression does not hold, the semiconductor device having the configuration of the first embodiment can still obtain the effect of suppressing thermal interference to some extent.

Second Embodiment

Figure 9:
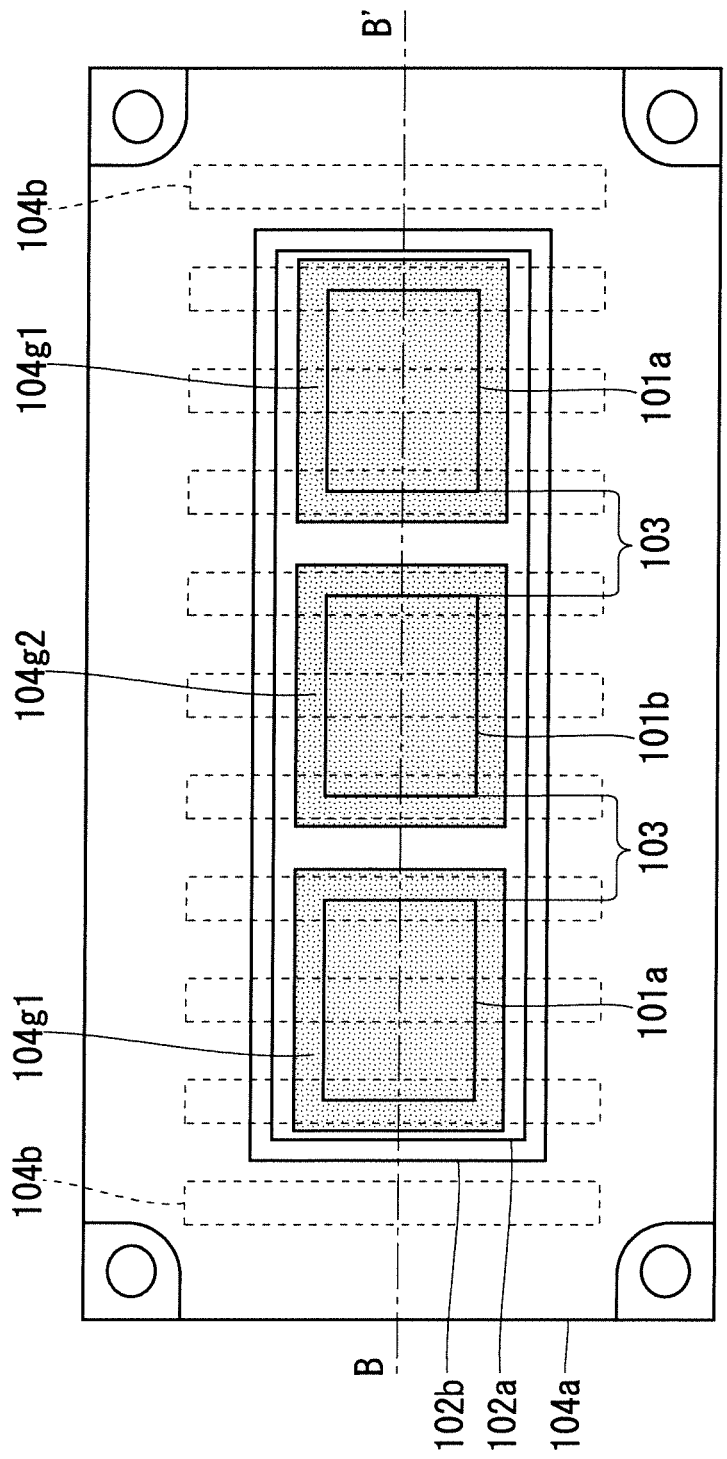
FIG. 9 A plan view illustrating a configuration of a semiconductor device according to a second embodiment.
Figure 10:
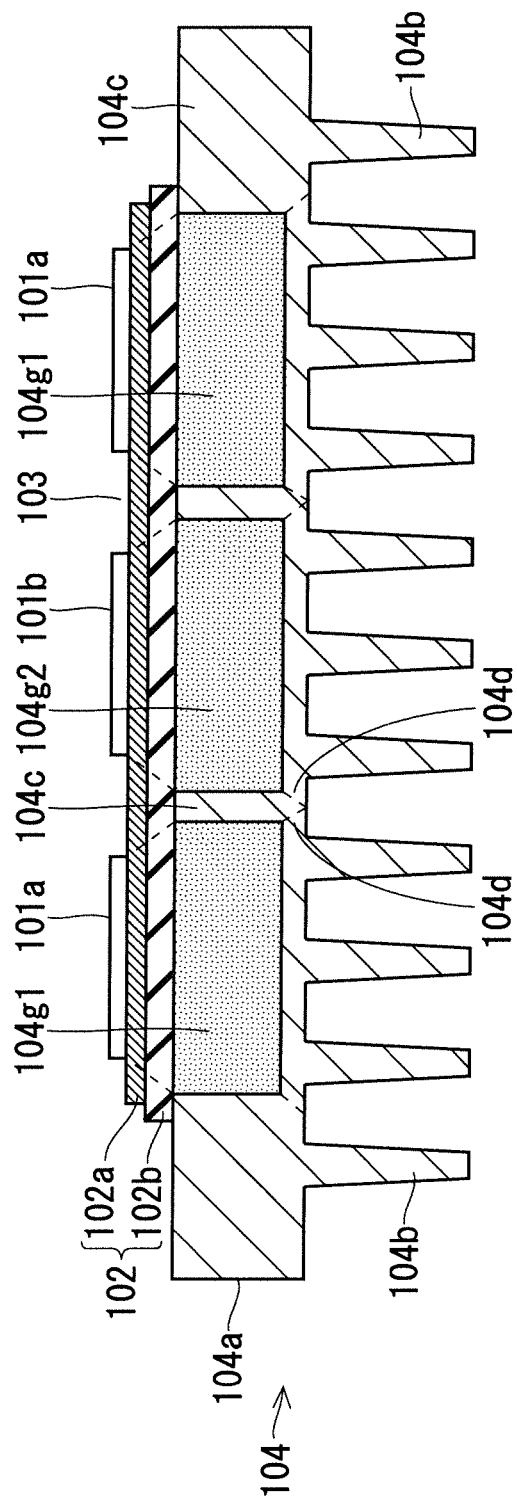
FIG. 10 A cross-sectional view illustrating the configuration of the semiconductor device according to the second embodiment.

FIG. 9 is a plan view illustrating a configuration of a semiconductor device according to a second embodiment, and FIG. 10 is a cross-sectional view taken along the line B-B' in FIG. 9.

As with the first embodiment, the semiconductor device according to the second embodiment includes first semiconductor elements 101a, a second semiconductor element 101b, a layer member 102, and a heat dissipation member 104. The second embodiment differs from the first embodiment in the heat dissipation member 104; therefore, the configuration of the heat dissipation member 104 will be mainly described below.

The heat dissipation member 104 according to the second embodiment includes a heat dissipation plate 104a including a thick portion 104c and thin portions 104d, and plate-shaped fins 104b. The fins 104b are the same as the fins 104b of the first embodiment.

The heat dissipation plate 104a includes first anisotropic heat dissipation members 104g1 and a second anisotropic heat dissipation member 104g2 in addition to the thick portion 104c and the thin portions 104d. Hereinafter, the thin portions 104d arranged closer to the first semiconductor elements 101a than semiconductor element other than first semiconductor elements 101a are referred to as thin portion 104d corresponding to first semiconductor element 101a. Similarly, the thin portions 104d arranged closer to the second semiconductor element 101b than semiconductor elements other than the second semiconductor element 101b are referred to as thin portion 104d corresponding to second semiconductor element 101b.

The first anisotropic heat dissipation members 104g1 are embedded between the thin portions 104d corresponding to first semiconductor elements 101a and the layer member 102, and are in contact with the insulating layer 102b below the first semiconductor elements 101a in the example of FIG. 10. Similarly, the second anisotropic heat dissipation member 104g2 is embedded between the thin portion 104d corresponding to second semiconductor element 101b and the layer member 102, and is in contact with the insulating layer 102b below the second semiconductor element 101b in the example of FIG. 10.

The thermal conductivity of the first anisotropic heat dissipation member 104g1 in the horizontal direction in FIG. 10 (the in-plane direction of the heat dissipation plate 104a) is smaller than the thermal conductivity of the first anisotropic heat dissipating member 104g1 in the vertical direction in FIG. 10 (the out-of-plane direction of the heat dissipating plate 104a). Similarly, the thermal conductivity of the second anisotropic heat dissipation member 104g2 in the horizontal direction in FIG. 10 (the in-plane direction of the heat dissipation plate 104a) is smaller than the thermal conductivity of the second anisotropic heat dissipating member 104g2 in the vertical direction in FIG. 10 (the out-of-plane direction of the heat dissipating plate 104a).

For the first and second anisotropic heat dissipation members 104g1 and 104g2, for example, a laminated body of graphite is used. The laminated body of graphite has a low thermal conductivity in a first direction, but a high thermal conductivity in a second direction perpendicular to the first direction. Therefore, when the laminated bodies of graphite are used for the first and second anisotropic heat dissipation members 104g1 and 104g2, the horizontal direction in FIG. 10 is set as the first direction, and the vertical direction and depth direction in FIG. 10 is set as the second directions.

In the second embodiment, as shown in FIG. 9, the outer circumference of the first anisotropic heat dissipation member 104g1 is located outside the outer circumference of the first semiconductor element 101a. Accordingly, by making the size of the first anisotropic heat dissipation member 104g1 larger than the size of the first semiconductor element 101a, the heat isotropically spreading in the layer member 102 from the first semiconductor element 101a is mostly transmitted to the anisotropic heat dissipation member 104g1. Similarly in the second embodiment, the outer circumference of the second anisotropic heat dissipation member 104g2 is located outside the outer circumference of the second semiconductor element 101b.

According to the semiconductor device according to the second embodiment describe above, even if the gap 103 is not wide, the thermal interference in which the heat from the first and second semiconductor elements 101a and 101b is accumulated is suppressed. Therefore, the heat dissipation characteristics of the semiconductor device is improved without increasing the size of the semiconductor device.

First Modification Example of Second Embodiment

Figure 11:
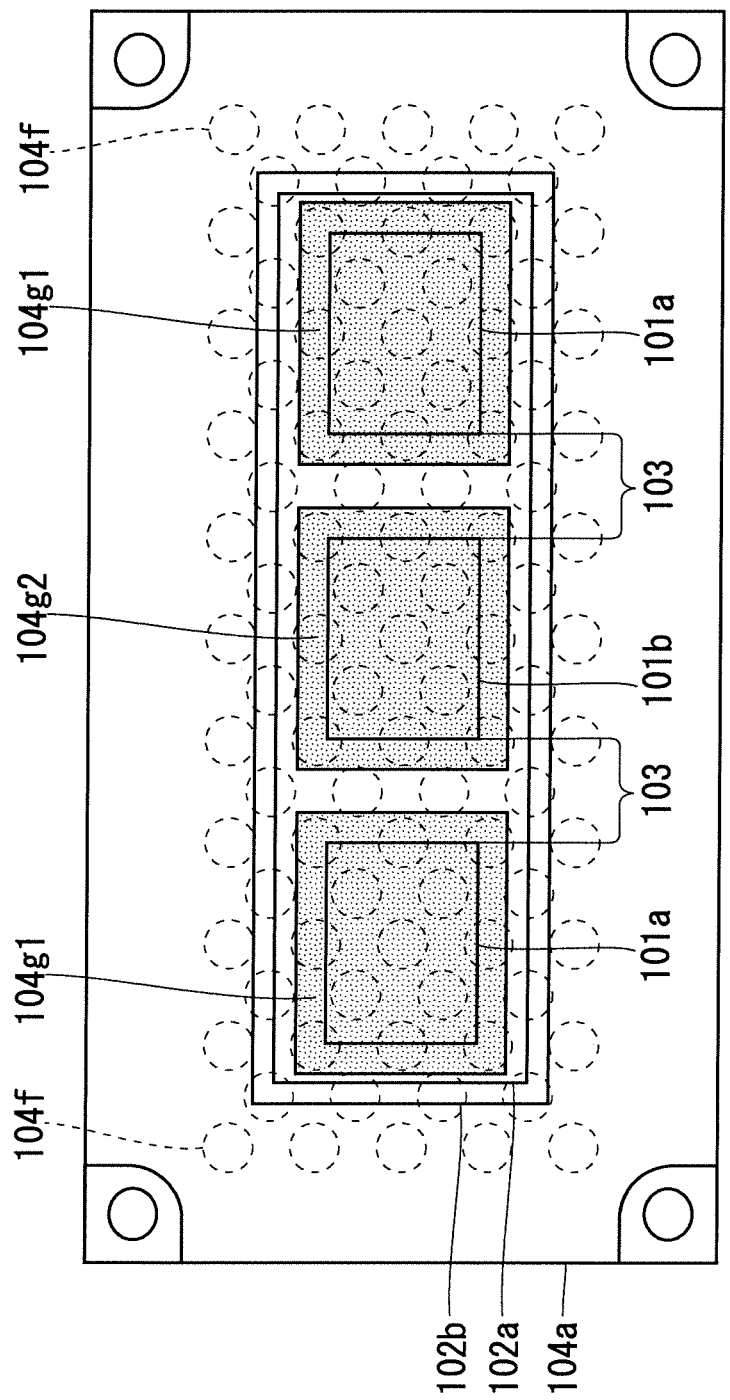
FIG. 11 A plan view showing a configuration of a semiconductor device according to a first modification example of the second embodiment.

FIG. 11 is a plan view of a configuration of a semiconductor device according to a first modification example of the second embodiment. In the second embodiment, the plate-shaped fins 104b protruding from the lower surface of heat dissipation plate 104a are provided on heat dissipation plate 104a. In the first modification example, the heat dissipation plate 104a is provided with pin-shaped fins 104f protruding from the lower surface of heat dissipation plate 104a. According to such a semiconductor device according to the first modification example, increasing the level of density of the pin-shaped fins 104f increases the area of the pin-shaped fins 104f directly in contact with water more than that of the plate-shaped fins 104b, enhancing the cooling efficiency.

Second Modification Example of Second Embodiment

Figure 12:
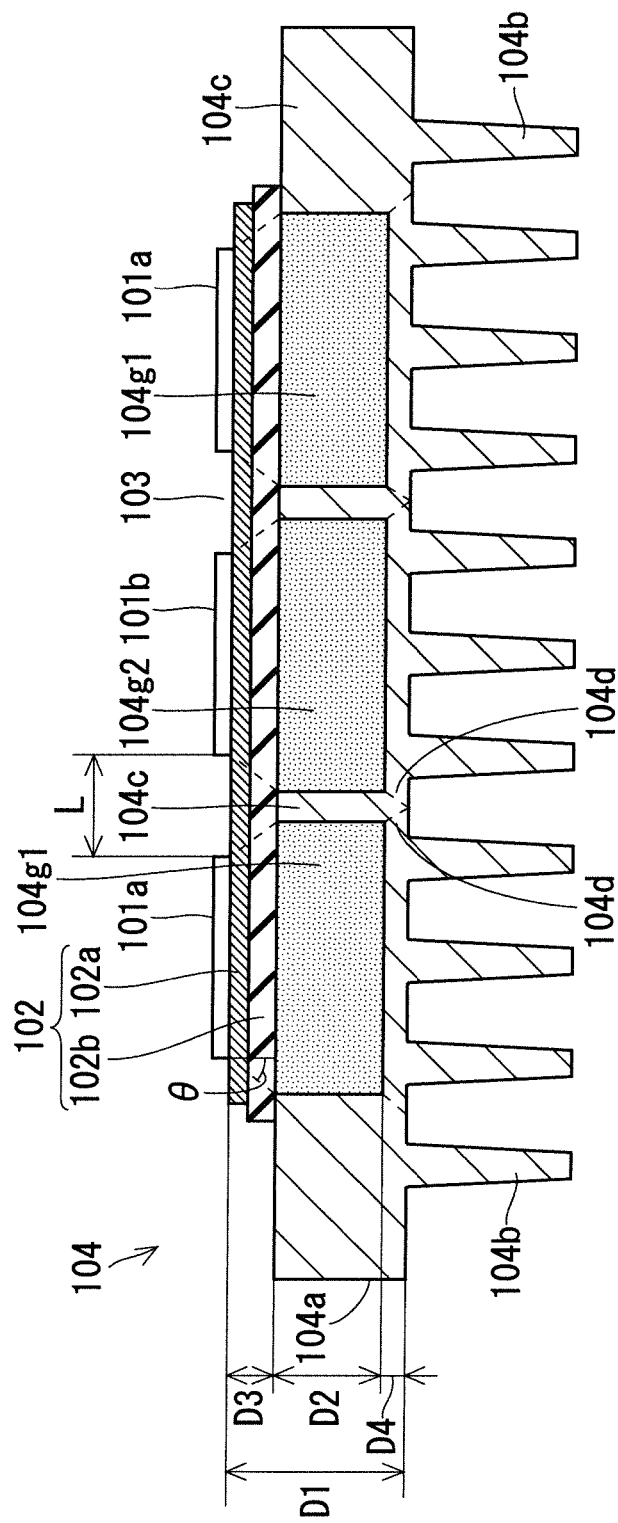
FIG. 12 A cross-sectional view illustrating a configuration of a semiconductor device according to a second modification example of the second embodiment.

FIG. 12 is a cross-sectional view of a configuration of a semiconductor device according to a second modification example of the second embodiment. Here, L represents the distance of the gap 103, D represents the total thickness of the layer member 102 and the thin portion 104d, and θ represents the angle between the direction in which heat spreads in the layer member 102 and the thin portion 104d as a whole and the out-of-plane direction of the heat dissipation plate 104a. When D1 represents the total thickness from the upper part of the layer member 102 to the lower part of the thin portions 104d, D2 represents the thickness of each of the first and second anisotropic heat dissipation members 104g1 and 104g2, D3 represents the thickness of the layer member 102, and D4 represents the thickness of the thin portions 104d, D=D1−D2=D3+D4 holds.

In this case, in the second modification example, L≥2×D×tan θ holds. That is, L≥2×(D1−D2)×tan θ, L/2≥(D1−D2)×tan θ, or D2≥D1−1/(2×tan θ) holds According to such a configuration, the thermal interference in which the heat from the first and second semiconductor elements 101a and 101b is accumulated is suppressed. Even if the expression does not hold, the semiconductor device having the configuration of the second embodiment can still obtain the effect of suppressing thermal interference to some extent.

The embodiments and the modifications can be combined, and the embodiments and the modifications can be appropriately modified or omitted.

The foregoing description is in all aspects illustrative and not restrictive. It is therefore understood that numerous modifications and variations can be devised without departing from the scope of the disclosure.

EXPLANATION OF REFERENCE SIGNS 101a first semiconductor element, 101b second semiconductor element, 102 layer member, 103 gap, 104a heat dissipation plate, 104b, 104f fin, 104c thick portion, 104d thin portion, 104e groove portion, 104g1 first anisotropic heat dissipation member, 104g2 second anisotropic heat dissipation member.

The invention claimed is:

1. A semiconductor device comprising;
a heat dissipation plate;
a layer member connected to the heat dissipation plate; and
a first semiconductor element and a second semiconductor element connected to the layer member on a side opposite to the heat dissipation plate, and separated from each other by a gap, wherein
the heat dissipation plate includes
a thick portion, and a thin portion being thinner than the thick portion and in contact with a groove portion provided on a surface of the heat dissipation plate opposite to the layer member, and overlapping the gap in plan view, and when L represents a distance of the gap, D represents a total thickness of the layer member and the thin portion, and θ represents an angle between the direction in which heat spreads in the layer member and the thin portion and the out-of-plane direction of the heat dissipation plate, L≥2×D×tanθ holds.

2. The semiconductor device according to claim 1, wherein
the heat dissipation plate is provided with plate-shaped fins protruding from the surface of the heat dissipation plate, and
a length of the groove portion is shorter than a length of the fins in plan view.

3. The semiconductor device according to claim 1, wherein
the heat dissipation plate is provided with plate-shaped fins protruding from the surface of the heat dissipation plate, and
a length of the groove portion is the same as a length of the fins in plan view.

4. The semiconductor device according to claim 1, wherein
the heat dissipation plate is provided with pin-shaped fins protruding from the surface of the heat dissipation plate.

5. A semiconductor device comprising;
a heat dissipation plate;
a layer member connected to the heat dissipation plate; and
a first semiconductor element and a second semiconductor element connected to the layer member on a side opposite to the heat dissipation plate, and separated from each other by a gap, wherein
the heat dissipation plate includes
a thick portion, and
a thin portion being thinner than the thick portion and overlapping the gap in plan view,
a first anisotropic heat dissipation member embedded between the thin portion corresponding to the first semiconductor element and the layer member, and
a second anisotropic heat dissipation member embedded between the thin portion corresponding to the second semiconductor element and the layer member, and
in the first anisotropic heat dissipating member and the second anisotropic heat dissipating member, thermal conductivity in an in-plane direction of the heat dissipating plate is smaller than thermal conductivity in an out-of-plane direction of the heat dissipating plate.

6. The semiconductor device according to claim 5, wherein
the heat dissipation plate is provided with pin-shaped fins protruding from the surface of the heat dissipation plate.

7. The semiconductor device according to claim 5, wherein
when L represents a distance of the gap, D represents a total thickness of the layer member and the thin portion, and θ represents an angle between the direction in which heat spreads in the layer member and the thin portion and the out-of-plane direction of the heat dissipation plate, L≥2×D×tanθ holds.

* * * * *